(12) United States Patent
Huang et al.

(10) Patent No.: US 7,221,916 B2
(45) Date of Patent: May 22, 2007

(54) SIGNAL ENHANCEMENT DEVICE FOR PHASE LOCK LOOP OSCILLATOR

(75) Inventors: Chuang-Chia Huang, Taipei Hsien (TW); Huang-Chen Shih, Taipei Hsien (TW)

(73) Assignee: Wistron Neweb Corp., Taipei Hsien (TW)

( * ) Notice: Subject to any disclaimer, the term of this patent is extended or adjusted under 35 U.S.C. 154(b) by 332 days.

(21) Appl. No.: 10/961,204

(22) Filed: Oct. 12, 2004

(65) Prior Publication Data

US 2005/0245205 A1    Nov. 3, 2005

(30) Foreign Application Priority Data

May 1, 2004    (TW) ............................... 93100121 A

(51) Int. Cl.
*H04B 1/18*    (2006.01)
*H04B 7/00*    (2006.01)
*H04B 7/185*    (2006.01)

(52) U.S. Cl. .................... 455/180.3; 455/265; 455/255

(58) Field of Classification Search ................ 455/427, 455/12.1, 85–86, 208–209, 255, 265, 180.5, 455/180.3, 260

See application file for complete search history.

(56) References Cited

U.S. PATENT DOCUMENTS

| | | | | |
|---|---|---|---|---|
| 4,551,689 A | * | 11/1985 | Scala et al. | .................... 331/2 |
| 5,353,311 A | * | 10/1994 | Hirata et al. | ................. 375/135 |
| 5,402,442 A | * | 3/1995 | Ishigaki | ....................... 375/137 |
| 6,714,760 B2 | * | 3/2004 | Robinett | .................... 455/3.02 |

FOREIGN PATENT DOCUMENTS

TW    169148    9/1991

OTHER PUBLICATIONS

"Density High Frequency Communication Circuit-Phase Lock Loop Oscillator and Frequency Divider".

* cited by examiner

*Primary Examiner*—Sonny Trinh
(74) *Attorney, Agent, or Firm*—Thomas, Kayden, Horstemeyer & Risley

(57) ABSTRACT

A reference signal enhancement device for phase lock loop oscillator. In the reference signal enhancement device, a band pass filtering unit is coupled to a reference signal to filter high frequency noise, low frequency noise, and harmonic components of the reference signal or components with frequency exceeding a predetermined frequency in the reference signal. A signal amplification device including three amplifiers connected in series is coupled to the band pass filter to convert the filtered reference signal.

23 Claims, 3 Drawing Sheets

SIGNAL ENHANCEMENT DEVICE FOR PHASE LOCK LOOP OSCILLATOR

BACKGROUND

The invention relates to a signal enhancement device, and more particularly, to a reference signal enhancement device and satellite signal transmitter using the same.

Typically, a phase lock loop oscillator (PLO), using an internal accurate reference signal with low frequency variation and a feedback of closed loop control system, drives operating frequency of an external inaccurate operating element with high frequency variation, such that the external operating element can be operated in the same phase and frequency as the reference signal, with the resulting phase locked state allowing can be application in communication modulation/demodulation circuits.

In one phase lock loop oscillator (PLO), one reference signal is required for circuit operation in which phase noise in loop bandwidth depends on reference signal. The reference signal, however, may interfere causing transmission loss, air noise and circuit noise and degrading operating performance of the phase lock loop oscillator during transmission.

SUMMARY

An embodiment of the invention provides a reference signal enhancement device capable of filtering and amplification. A band pass filtering unit is coupled to a reference signal to filter high frequency noise, low frequency noise, and harmonic components of the reference signal or components with frequency higher than a predetermined frequency in the reference signal, wherein the reference signal has the predetermined frequency. A signal amplification device including three amplifiers connected in series is coupled to the band pass filter to convert the filtered reference signal.

BRIEF DESCRIPTION OF THE DRAWINGS

The present invention can be more fully understood by the subsequent detailed description and examples with reference made to the accompanying drawings, wherein.

DETAILED DESCRIPTION

Figure 1:
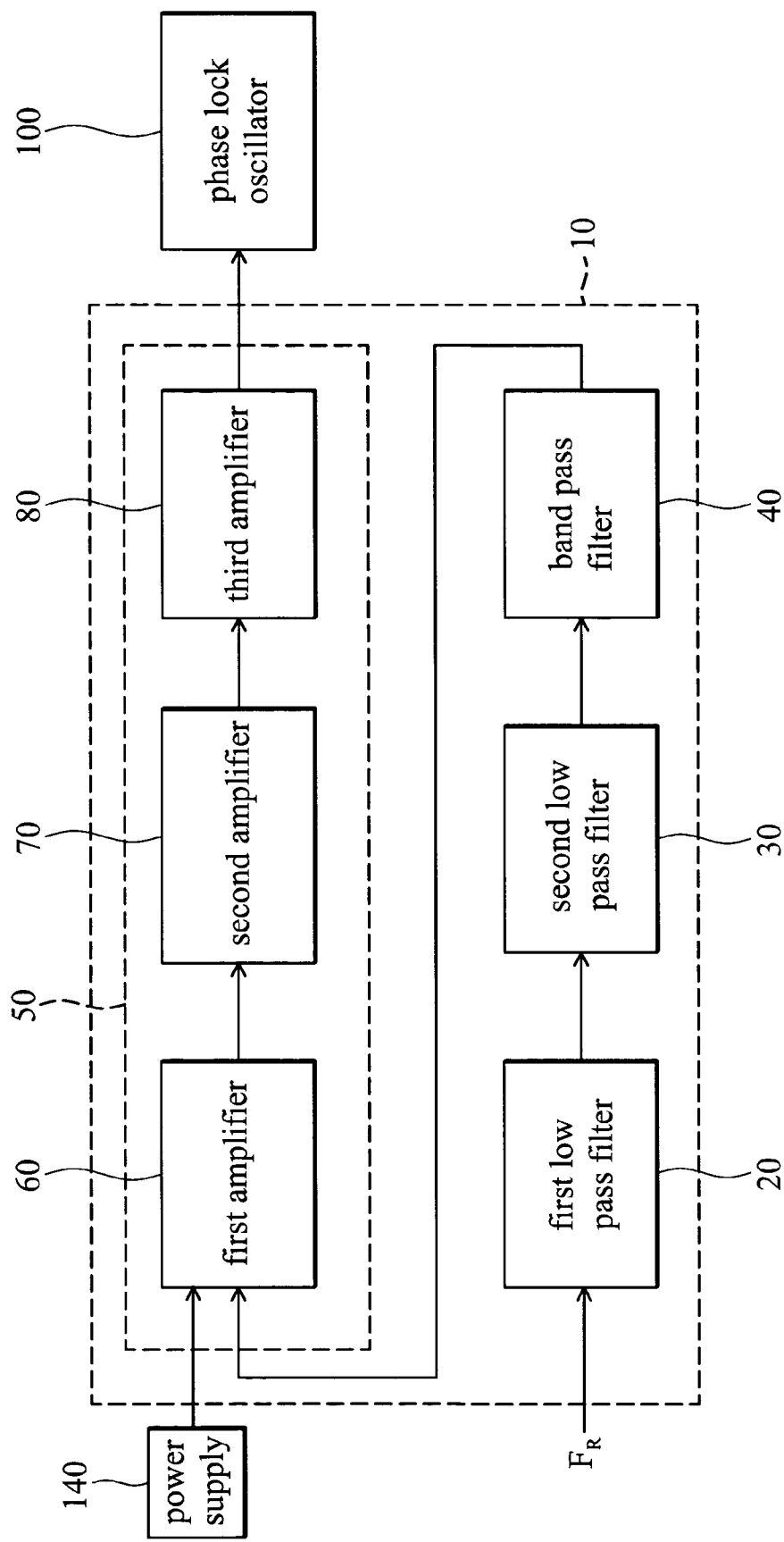
FIG. 1 is diagram of a reference signal enhancement device of an embodiment of the invention.

As shown in FIG. 1, a reference signal enhancement device 10 includes a power supply 140, a first low pass filter 20, a second low pass filter 30, a bandpass filter 40, and a signal amplification device 50.

Operations of the reference signal enhancement device 10 according to the embodiment of the invention are described as follows.

The first low pass filter 20, the second low pass filter 30, and the band pass filter 40 constitute a band pass filtering unit. The band pass filtering unit is coupled to a reference signal $F_R$ to filter high frequency noise, low frequency noise, and harmonic components of the reference signal or components with frequency higher than a predetermined frequency in the reference signal $F_R$. The reference signal $F_R$ has the predetermined frequency.

The first low pass filter 20 is coupled to the reference signal $F_R$ to filter a high frequency component, such as a frequency signal with an ultrahigh frequency (UHF) or higher, in the reference signal $F_R$ so as to eliminate the high frequency noise. The second low pass filter 30 is coupled between the first low pass filter 20 and the band pass filter 40 to filter harmonic components of the reference signal $F_R$ or components with frequency higher than the predetermined frequency in the reference signal $F_R$. For example, the harmonic components can be harmonic signals of the reference signal $F_R$. The band pass filter 40 is coupled to the second low pass filter 30 to filter a low frequency component in the reference signal $F_R$ so as to eliminate the low frequency noise. For example, the low frequency component can be a signal with frequency lower than the predetermined frequency.

The signal amplification device 50 is coupled to the band pass filter 40 to convert the filtered reference signal $F_R$ from the band pass filtering unit. The signal amplification device 50 includes the first, second and third amplifiers 60, 70 and 80 connected in series and coupled to power supply 140. The first amplifier 60 is coupled to the band pass filter 40 to enlarge available dynamic range of input power of the reference signal $F_R$ and lower the input power of the reference signal $F_R$.

The second amplifier 70 is coupled between the first and third amplifiers 60 and 80, and the first and second amplifiers 60 and 70 have opposite input phases to amplify the filtered reference signal $F_R$ and lower low frequency noise from the power supply 140. The third amplifier 80 is operated in a saturation state to amplify amplified reference signal $F_R$ from the second amplifier 70 and output a signal $F_{R'}$. Because, here, the third amplifier 80 is operated in the saturation state, the gain of the third amplifier 80 and low frequency noise caused by the power supply 140 can be reduced, and the signal output from the third amplifier limited within a stable power range.

Because of the reference signal enhancement device 10, the reference signal $F_R$ has a larger and stable input power dynamic range, such that noise interfering with the reference signal $F_R$ can be reduced. Further, transmission loss, air noise and circuit noise interfering with the reference signal $F_R$ during transmitting to the phase lock loop oscillator 100, can also be prevented.

Figure 2:
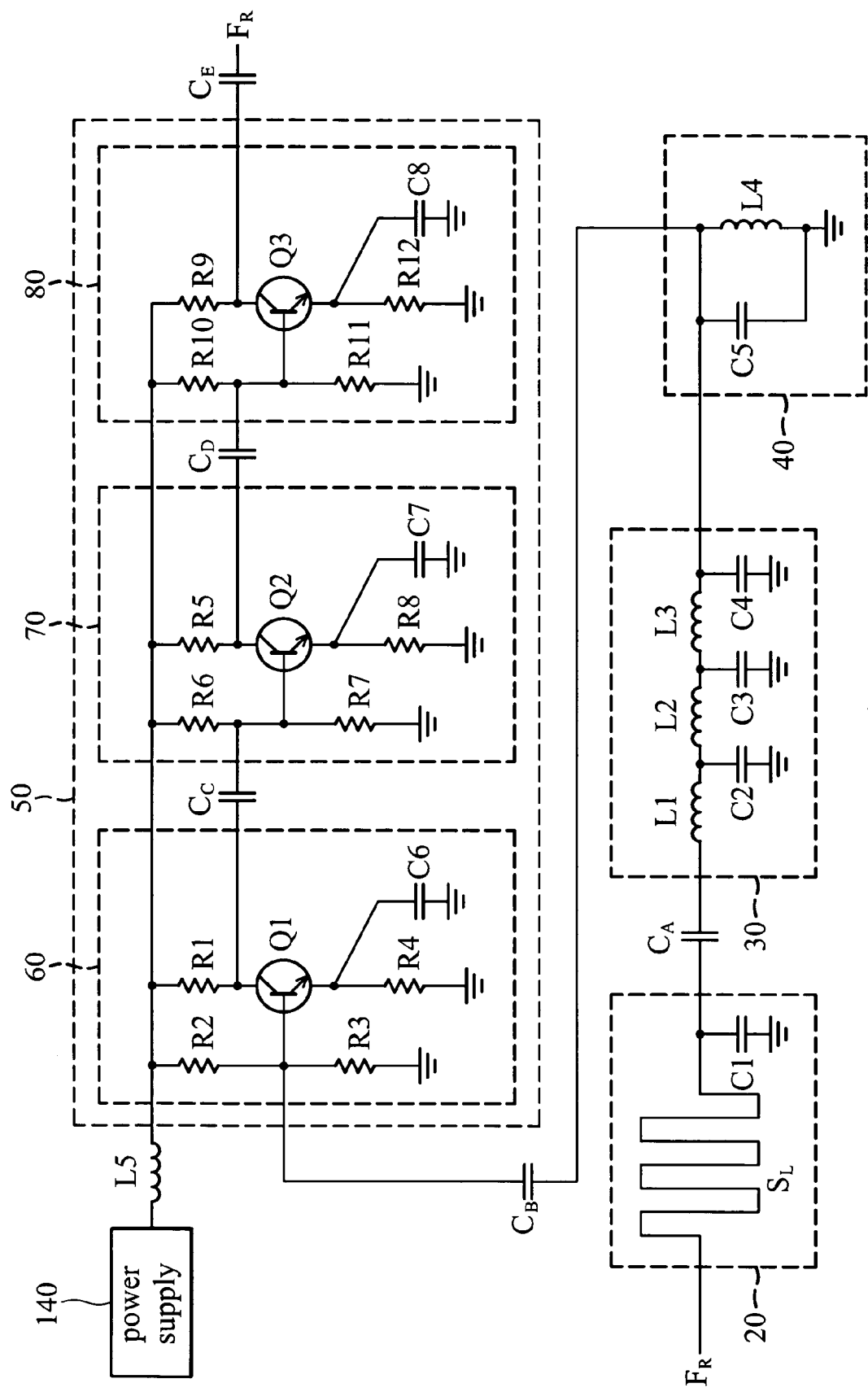
FIG. 2 is a circuit diagram of the reference signal enhancement device of the embodiment shown in FIG. 1.

FIG. 2 is a circuit diagram of the reference signal enhancement device 10 shown in FIG. 1. As shown in FIG. 2, the first low pass filter 20 includes a strip line $S_L$ coupled to the reference signal $F_R$, and a first capacitor C1 coupled between the strip line $S_L$, the first coupling capacitor $C_A$ and a conductive ground. In this embodiment, the strip line $S_L$ can be constructed as an inductor. The first low pass filter 20 is coupled to the reference signal $F_R$ to filter a high frequency component, such as a frequency signal with an ultrahigh frequency (UHF) or higher, in the reference signal $F_R$ so as to eliminate the high frequency noise.

The second low pass filter 30 is coupled between the first low pass filter 20 and the band ass filter 40 to filter harmonic components of the reference signal $F_R$ or components with frequency higher than the predetermined frequency in the reference signal $F_R$. For example, the harmonic component scan be harmonic signals of the reference signal $F_R$. The second low pass filter 30 includes three inductors L1, L2 and L3 and three capacitors C2, C3 and C4. The first inductor L1 is coupled between the first coupling capacitor $C_A$ and the second inductor L2, the second inductor L2 is coupled between the first inductor L1 and L3, the third inductor L3 is coupled between the second inductor L2 and the band pass filter 40. The second capacitor C2 is coupled between the electrical ground and the first and second inductors L1 and L2, the third capacitor C3 is coupled between the electrical ground and the second and third inductors L2 and L3, and the fourth capacitor C4 is coupled between the electrical ground, the third inductor L3 and the band pass filter 40.

The band pass filter 40 is coupled to the second low pass filter 30 to filter a low frequency component in the reference signal $F_R$ so as to eliminate the low frequency noise. For example, the low frequency component can be a signal with frequency lower than the predetermined frequency. The band pass filter 40 includes a fifth capacitor C5 and a fourth inductor L4 connected in parallel.

The signal amplification device 50 is coupled to the band pass filter 40 to convert the filtered reference signal $F_R$ from the band pass filtering unit. The signal amplification device 50 includes first, second and third amplifiers 60, 70 and 80 connected in series and coupled to power supply 140. The first amplifier 60 is coupled to the band pass filter 40 to enlarge available dynamic range of input power of the reference signal $F_R$ and lower the input power of the reference signal $F_R$.

The first amplifier 60 includes a first transistor Q1, resistor R1~R4, and a capacitor C6. The first transistor Q1 has a collector terminal coupled to the second amplifier 70 through a coupling capacitor $C_C$ and a base terminal coupled to the band pass filter 40 through the coupling capacitor $C_B$, and an emitter terminal coupled to the electrical ground through a capacitor C6. The collector terminal of the transistor Q1 is also coupled to the power supply 140 through the resistor R1 and a fifth inductor L5, the emitter terminal of the transistor Q1 is also coupled to the electrical ground through the resistor R4, and the base terminal of the transistor Q1 is also coupled to the electrical ground through the resistor R3 and coupled to the power supply 140 through the resistor R2 and the fifth inductor L5.

The second amplifier 70 is coupled between the first and third amplifiers 60 and 80, and the first and second amplifiers 60 and 70 have opposite input phases to amplify the filtered reference signal $F_R$ and lower the low frequency noises from the power supply 140. Power supply 140 can be a power rail. The second amplifier 70 includes a second transistor Q2, resistor R5~R8, and a capacitor C7. The second transistor Q2 has a collector terminal coupled to the second amplifier 80 through a coupling capacitor $C_D$ and a base terminal coupled to the first amplifier 60 through the coupling capacitor $C_C$, and an emitter terminal coupled to the electrical ground through a capacitor C7. The collector terminal of the transistor Q2 is also coupled to the power supply 140 through the resistor R5 and the fifth inductor L5, the emitter terminal of the transistor Q2 is also coupled to the electrical ground through the resistor R8, and the base terminal of the transistor Q2 is also coupled to the electrical ground through the resistor R7 and coupled to the power supply 140 through the resistor R6 and the fifth inductor L5.

The third amplifier 80 is operated in a saturation state to amplify amplified reference signal $F_R$ from the second amplifier 70. Because the third amplifier 80 is operated in the saturation state, the gain of the third amplifier 80 and low frequency noise caused by the power supply 140 can be reduced, and the signal output from the third amplifier limited within a stable power range. The third amplifier 80 includes a second transistor Q3, resistor R9~R12, and a capacitor C8. The second transistor Q3 has a collector terminal coupled to a PLO 100 through a coupling capacitor $C_E$ and a base terminal coupled to the second amplifier 70 through the coupling capacitor $C_D$, and an emitter terminal coupled to the electrical ground through a capacitor C8. The collector terminal of the transistor Q3 is also coupled to the power supply 140 through the resistor R9 and the fifth inductor L5, the emitter terminal of the transistor Q3 is also coupled to the electrical ground through the resistor R12, and the base terminal of the transistor Q3 is also coupled to the electrical ground through the resistor R11 and coupled to the power supply 140 through the resistor R10 and the fifth inductor L5.

Direct current (DC) component and low frequency noise between the amplifiers can be filtered by the coupling capacitors $C_A$, $C_B$, $C_C$, $C_D$ and $C_E$ filter, and the fifth inductor L5 is coupled between the power supply 140 and the signal amplification device 50 to lower high frequency noise.

Figure 3:
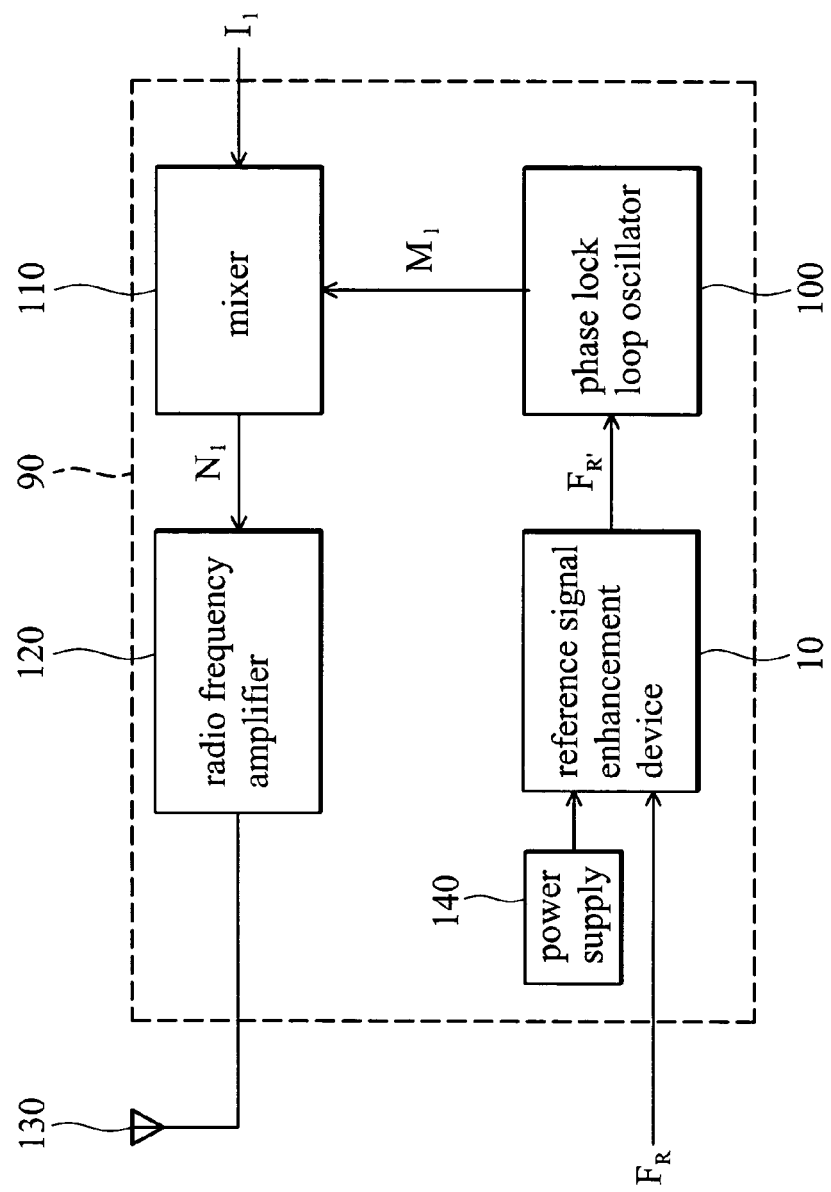
FIG. 3 is a diagram of a satellite signal transmitter of an embodiment of the invention.

FIG. 3 is a diagram of a satellite signal transmitter of an embodiment of the invention. As shown in FIG. 3, the satellite signal transmitter 90 includes a power supply 140, a reference signal enhancement device 10, a phase lock loop oscillator 100, a mixer 110 and a radio frequency amplifier 120, wherein the structure of the reference signal enhancement device 10 is the same as described above, and is thus omitted for simplicity.

Operation of the satellite signal transmitter 90 according to an embodiment of the invention is described as follows.

The first low pass filter 20 is coupled to the reference signal $F_R$ to filter a high frequency component, such as a frequency signal with an ultrahigh frequency (UHF) or higher, in the reference signal $F_R$ so as to eliminate high frequency noise. The second low pass filter 30 is coupled between the first low pass filter 20 and the band pass filter 40 to filter harmonic components of the reference signal $F_R$ or components with frequency higher than the predetermined frequency in the reference signal $F_R$. The band pass filter 40 is coupled to the second low pass filter 30 to filter a low frequency component in the reference signal $F_R$ so as to eliminate the low frequency noise. For example, the low frequency component can be a signal with frequency lower than the predetermined frequency.

The first amplifier 60 is coupled to the band pass filter 40 to increase available dynamic range of input power of the reference signal $F_R$ and lower the input power of the reference signal $F_R$. The second amplifier 70 is coupled between the first and third amplifier 60 and 80, the first and second amplifiers 60 and 70 have opposite input phases to amplify the filtered reference signal $F_R$ and lower the low frequency noises from the power supply 140. The third amplifier 80 is operated in a saturation state to amplify amplified reference signal $F_R$ from the second amplifier 70 and output a signal $F_{R'}$ to the phase lock loop oscillator 100. Because the third amplifier 80 is operated in the saturation state, the gain of the third amplifier 80 and low frequency noise caused by the power supply 140 can be reduced, and the signal $F_{R'}$ output from the third amplifier limited within a stable power range. Further, the signal $F_{R'}$ can be regarded as the reference signal $F_R$ without high frequency noise, low frequency noise, and harmonic components thereof.

The phase lock loop oscillator 100 is coupled to the reference signal enhancement device 10 to output a carrier signal $M_1$ according to the amplified reference signal $F_{R'}$ from the third amplifier 80. The mixer 110 is coupled to the PLO 100 to synthesize the carrier signal $M_1$ and an input signal $I_1$ to a first signal $N_1$. The radio frequency amplifier 120 is coupled to the mixer 110 to amplifier to the first signal $N_1$ and output through an antenna.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A reference signal enhancement device for phase lock loop oscillators (PLO), comprising:
   a band pass filtering unit coupled to a reference signal to filter high frequency noise, low frequency noise, and harmonic components of the reference signal or components with frequency exceeded a predetermined frequency in the reference signal, wherein the reference signal has the predetermined frequency; and
   a signal amplification device coupled to the band pass filter to convert the filtered reference signal, wherein the band pass filtering unit comprises:
      a first low pass filter coupled to the reference signal to filter a high frequency component in the reference signal so as to eliminate the high frequency noise;
      a second low pass filter coupled to the first low pass filter to filter harmonic components of the reference signal or components with frequency higher than the predetermined frequency in the reference signal; and
      a band pass filter coupled to the second low pass filter to filter a low frequency component in the reference signal so as to eliminate the low frequency noise.

2. The reference signal enhancement device as claimed in claim 1, wherein the signal amplification device comprises first, second and third amplifiers connected in series and coupled to a power rail, wherein the first and second amplifiers have opposite input phases to amplify the filtered reference signal and lower the low frequency noises from the power rail, and the third amplifier is operated in a saturation state to amplify amplified reference signal from the second amplifier.

3. The reference signal enhancement device as claimed in claim 2, further comprising a first coupling capacitor coupled between the first and second low pass filters, a second coupling capacitor coupled between the band pass filter and the first amplifier, a third coupling capacitor coupled between the second and third amplifiers, a fourth capacitor coupling capacitor coupled between the first and second amplifiers and a fifth coupling capacitor coupled to an output terminal of the third amplifier.

4. The reference signal enhancement device as claimed in claim 3, wherein the first low pass filter comprises:
   a strip line coupled to the reference signal; and
   a first capacitor coupled between the strip line, the first coupling capacitor and a conductive ground, wherein the strip line constructs as an inductor.

5. The reference signal enhancement device as claimed in claim 4, wherein the second low pass filter comprises:
   a first inductor coupled to the first coupling capacitor;
   a second inductor coupled to the first inductor;
   a third inductor coupled between the second inductor and the band pass filter;
   a second capacitor coupled between the electrical ground and the first and second inductors;
   a third capacitor coupled between the electrical ground and the second and third inductors; and
   a fourth capacitor coupled between the electrical ground, the third inductor and the band pass filter.

6. The reference signal enhancement device as claimed in claim 4, wherein the second low pass filter comprises:
   a first inductor coupled to the first coupling capacitor;
   a second inductor coupled to the first inductor;
   a third inductor coupled between the second inductor and the band pass filter;
   a second capacitor coupled between the electrical ground and the first and second inductors;
   a third capacitor coupled between the electrical ground and the second and third inductors; and
   a fourth capacitor coupled between the electrical ground, the third inductor and the band pass filter.

7. The reference signal enhancement device as claimed in claim 2, further comprising a fifth inductor coupled between the power rail and the signal amplification device.

8. The reference signal enhancement device as claimed in claim 2, wherein the high frequency component is a frequency signal with an ultrahigh frequency (UHF) or higher in the reference signal.

9. The reference signal enhancement device as claimed in claim 1, wherein the signal amplification device comprises first, second and third amplifiers connected in series and coupled to a power rail, wherein the first and second amplifiers have opposite input phases to amplify the filtered reference signal and lower the low frequency noises from the power rail, and the third amplifier is operated in a saturation state to amplify amplified reference signal from the second amplifier.

10. The reference signal enhancement device as claimed in claim 1, wherein the first low pass filter comprises:
    a strip line coupled to the reference signal; and
    a first capacitor coupled between the strip line, the first coupling capacitor and a conductive ground, wherein the strip line constructs as an inductor.

11. The reference signal enhancement device as claimed in claim 1, wherein the band pass filter comprises a fifth capacitor and a fourth inductor connected in parallel.

12. A satellite signal transmitter, comprising:
    a reference signal enhancement device, coupled to a reference signal, comprising:
    a band pass filtering unit coupled to a reference signal to filter high frequency noise, low frequency noise, and harmonic components of the reference signal or components with frequency exceeding a predetermined frequency in the reference signal, wherein the reference signal has the predetermined frequency; and
    a signal amplification device coupled to the band pass filter to convert the filtered reference signal;
    a phase lock loop oscillator (PLO) coupled to the reference signal enhancement device to output a carrier signal according to the amplified reference signal output from the third amplifier;
    a mixer coupled to the PLO to synthesize the carrier signal and an input signal to a first signal; and
    a radio frequency amplifier coupled to the mixer to amplify the first signal and output the first signal through an antenna.

13. The reference signal enhancement device as claimed in claim 12, wherein the band pass filtering unit comprises:
    a first low pass filter coupled to the reference signal to filter a high frequency component in the reference signal so as to eliminate the high frequency noise;
    a second low pass filter coupled to the first low pass filter to filter harmonic components of the reference signal or components with frequency exceeding the predetermined frequency in the reference signal; and a band pass filter coupled to the second low pass filter to filter a low frequency component in the reference signal so as to eliminate the low frequency noise.

14. The reference signal enhancement device as claimed in claim 13, wherein the signal amplification device comprises first, second and third amplifiers connected in series and coupled to a power rail, wherein the first and second amplifiers have opposite input phases to amplify the filtered reference signal and lower the low frequency noises from the power rail, and the third amplifier is operated in a saturation state to amplify amplified reference signal from the second amplifier.

15. The reference signal enhancement device as claimed in claim 14, further comprising a first coupling capacitor coupled between the first and second low pass filters, a second coupling capacitor coupled between the band pass filter and the first amplifier, a third coupling capacitor coupled between the second and third amplifiers, a fourth coupling capacitor coupled between the first and second amplifiers and a fifth coupling capacitor coupled to an output terminal of the third amplifier.

16. The reference signal enhancement device as claimed in claim 15, wherein the first low pass filter comprises:
 a strip line coupled to the reference signal; and
 a first capacitor coupled between the strip line, the first coupling capacitor and a conductive ground, wherein the strip line constructs as an inductor.

17. The reference signal enhancement device as claimed in claim 16, wherein the second low pass filter comprises:
 a first inductor coupled to first coupling capacitor;
 a second inductor coupled to the first inductor;
 a third inductor coupled between the second inductor and the band pass filter;
 a second capacitor coupled between the electrical ground and the first and second inductors;
 a third capacitor coupled between the electrical ground and the second and third inductors; and
 a fourth capacitor coupled between the electrical ground, the third inductor and the band pass filter.

18. The reference signal enhancement device as claimed in claim 14, further comprising a fifth inductor coupled between the power rail and the signal amplification device.

19. The reference signal enhancement device as claimed in claim 14, wherein the high frequency component is a frequency signal with an ultrahigh frequency (UHF) or higher in the reference signal.

20. The reference signal enhancement device as claimed in claim 13, wherein the first low pass filter comprises:
 a strip line coupled to the reference signal; and
 a first capacitor coupled between the strip line, the first coupling capacitor and a conductive ground, wherein the strip line constructs as an inductor.

21. The reference signal enhancement device as claimed in claim 13, wherein the second low pass filter comprises:
 a first inductor coupled to the first coupling capacitor;
 a second inductor coupled to the first inductor;
 a third inductor coupled between the second inductor and the band pass filter;
 a second capacitor coupled between the electrical ground and the first and second inductors;
 a third capacitor coupled between the electrical ground and the second and third inductors; and
 a fourth capacitor coupled between the electrical ground, the third inductor and the band pass filter.

22. The reference signal enhancement device as claimed in claim 13, wherein the band pass filter comprises a fifth capacitor and a fourth inductor connected in parallel.

23. The reference signal enhancement device as claimed in claim 12, wherein the signal amplification device comprises first, second and third amplifiers connected in series and coupled to a power rail, wherein the first and second amplifiers have opposite input phases to amplify the filtered reference signal and lower the low frequency noises from the power rail, and the third amplifier is operated in a saturation state to amplify amplified reference signal from the second amplifier.

* * * * *